United States Patent
Cathelin et al.

(10) Patent No.: US 7,187,240 B2
(45) Date of Patent: Mar. 6, 2007

(54) INTEGRATED ELECTRONIC CIRCUIT COMPRISING A TUNABLE RESONATOR

(75) Inventors: Andreia Cathelin, Laval (FR);
Stephane Razafimandimby, Lille (FR);
Didier Belot, Rives (FR);
Jean-François Carpentier, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/025,781

(22) Filed: Dec. 29, 2004

(65) Prior Publication Data

US 2005/0189999 A1 Sep. 1, 2005

(30) Foreign Application Priority Data

Dec. 29, 2003 (FR) .................................. 03 15480
Apr. 2, 2004 (FR) .................................. 04 03492

(51) Int. Cl.
*H03B 5/32* (2006.01)
*H03L 1/02* (2006.01)
*H03L 7/00* (2006.01)
*H03L 7/099* (2006.01)

(52) U.S. Cl. ..................... 331/2; 331/17; 331/36 C; 331/36 L; 331/107 A; 331/176

(58) Field of Classification Search ............ 331/2, 331/17–18, 25, 36 R, 36 C, 36 L, 107 A, 331/176
See application file for complete search history.

(56) References Cited

U.S. PATENT DOCUMENTS 5,043,681 A  8/1991 Tanemura et al. ...... 331/107 A

| 6,950,639 B2 | 9/2005 | Gogolla et al. ......... 455/196.1 |
| 7,030,718 B1 | 4/2006 | Scherer ...................... 333/188 |
| 2001/0028277 A1 | 10/2001 | Northam ...................... 331/34 |
| 2005/0266823 A1* | 12/2005 | Cathelin et al. ............ 455/344 |

FOREIGN PATENT DOCUMENTS

| FR | 2 455 816 | 11/1980 |
| GB | 615841 | 1/1949 |
| WO | WO 02/25813 A1 | 3/2002 |

OTHER PUBLICATIONS

Akbari-Dilmaghani, R., et al., "A High Q RF CMOS Differential Active Inductor," in Proceedings of the IEEE Electronics, Circuits and Systems Int'l. Conference, Lisboa, Portugal, Sep. 7-10, 1998, pp. 157-160.

Koroglu, M., et al., "A 1.9Ghz Image-Reject Front-End with Automatic Tuning in a 0.15 μm CMOS Technology," in Proceedings of the IEEE Int'l. Solid State Circuits Conference, San Francisco, CA, Feb. 9-13, 2003, pp. 1-10.

* cited by examiner

*Primary Examiner*—David Mis
(74) *Attorney, Agent, or Firm*—Lisa K. Jorgenson; Dennis M. de Guzman; Seed IP Law Group PLLC

(57) ABSTRACT

An integrated electronic circuit comprises at least first and second variable resonator elements that can be tuned by means of an electric signal ($V_{tune}$) and that are arranged on the same silicon substrate, and that are respectively integrated into a Master circuit and a Slave circuit. Each resonator element is associated with a first inductive partner element set in the vicinity of the resonant and antiresonant frequencies; and with a second capacitive partner element, at least one of said partner elements being adjustable by means of said electric signal ($V_{tune}$). Controlling both partner elements could be done either by means of an adjustable capacitor, as a varactor, or by means of an inductor, passive or active, fixed or variable.

31 Claims, 8 Drawing Sheets

INTEGRATED ELECTRONIC CIRCUIT COMPRISING A TUNABLE RESONATOR

BACKGROUND OF THE INVENTION

1. Field of the Invention

The present disclosure generally relates to the field of microelectronic circuits and more particularly but not exclusively an integrated electronic circuit comprising an adjustable resonator.

2. Description of the Related Art

Acoustic resonators are components that have been the subject of many studies. Traditionally, one distinguishes between Surface Acoustic Resonator (SAW) and Bulk Acoustic Resonators (BAW). In SAWs, the acoustic resonator is located on the surface of a semiconductor product while, in BAWs, it lays inside a volume delimited between a lower electrode and a higher electrode so that the acoustic wave develops in this volume.

Acoustic resonators are frequently used in radio frequency (RF) filtering and in particular in mobile telephony. They are likely, however, to be useful in many other applications in the future but the principal obstacle to the use of acoustic resonators lies in the difficulty of integrating them into a semiconductor product.

Indeed, the characteristics of the components issued from production lines show great dispersions, and even BAW-type resonators that are the one's that are best suited for arrangement on a silicon substrate. Even with particularly ambitious and inevitably expensive specifications—for example, with a tolerance of about 1 percent for resonator element dimensions, dispersion on electric characteristics of the resonator cannot be eliminated.

Such a dispersion problem is typically solved by selectively choosing components so as to retain only those products from the production lines that comply with precise specifications.

This approach cannot be chosen when aiming to integrate such an acoustic resonator on a substrate. Indeed, in this case, discarding a great number of manufactured products only because part of the product—which only accounts for a fraction of the added value of this product—does not show the characteristics specified in specifications, is quite out of the question.

This constitute a crippling obstacle to the direct integration of such acoustic components into an integrated circuit, this obstacle being likely to slow down the general use of acoustic resonator, this not only in RF applications.

The following documents illustrate background art:

Reference work "RF MEMS CIRCUIT DESIGN FOR WIRELESS COMMUNICATIONS", Hector J De Los Santos, Artech House, ISBN 1-58033 329-9, 2002, p. 163 and following, comprise general information on BAW-type acoustic resonators. This work does not address the problem of BAW resonator integration into an integrated circuit.

The integration of BAW-type resonators into an integrated circuit has been considered in the document "FBAR FILTERS AT GHZ FREQUENCIES" by C. Vale, J. Rosenbaum, S. Horwitz, S. Krishnasvamy and R. Moore, in FORTY FOURTH ANNUAL SYMPOSIUM ONE FREQUENCY CONTROL, IEEE INTERNATIONAL FREQUENCY CONTROL SYMPOSIUM, 1990. This document describes the use, on the same substrate, of FBAR-type components in combination with passive elements in order to make filtering circuits. This document does not address the problem of the integration of these components into a semiconductor product and moreover, it does not describe how to increase the precision of the manufacturing process to allow such integration.

U.S. Pat. No. 5,446,306 entitled "THIN FILM VOLTAGE-TUNED SEMICONDUCTOR BULK ACOUSTIC RESONATOR (SBAR)" discloses tuning of a BAW resonator by means of a d.c. voltage, but does not actually describe how to proceed in practical terms. Moreover, it completely ignores the issue of the integration of such resonators.

U.S. Pat. No. 5,714,917 entitled "DEVICE INCORPORATING A TUNABLE THIN FILM BULK ACOUSTIC RESONATOR FOR PERFORMING AMPLITUDE AND PHASE MODULATION" discloses a BAW-type resonator which is made adjustable in order to carry out phase and amplitude modulation. This document by no means describes how to adjust resonator frequencies nor does it show how to facilitate its integration into an integrated circuit while getting around the limitations inherent in the manufacturing process.

U.S. Pat. No. 2004/0033794 entitled "RESONATOR CONFIGURATION", published on Feb. 19, 2004 discloses a process for tuning a resonator mounted on an integrated circuit by means of a second reference resonator also mounted on the same substrate. The reference resonator is used in a VCO-type (Voltage Control Oscillator) circuit to generate a local oscillation frequency. This patent does not indicate how to practically proceed to obtain a precise and effective tuning of the circuit using the resonator.

The French Patent Application No 0315480 (applicant reference 03-GR1-267) filed on Dec. 29, 2003 by the present applicant, entitled "Résonateur acoustique intégrable et procédé d'intégration d'un tel résonateur" and not published to the date of filing of the present application, describes a new acoustic component that can be easily integrated into a silicon substrate. This component is based on the use of an acoustic resonator of the BAW-type (Bulk Acoustic Wave) having two resonant frequencies and a high coefficient of quality. This resonator is associated with two judiciously selected partner elements, namely a first inductive element, variable or not variable, and a second capacitive element that is generally variable. The inductive element is set in the vicinity of said first and second resonant frequencies. The variability of both inductive and capacitive partner elements makes it possible to set the characteristics of the unit formed by the acoustic resonator associated with its two partner elements, and in particular resonant and antiresonant frequencies, and their respective quality factors.

A new tunable resonator element results, having a high quality coefficient as well as a remarkable aptitude for integration into a semiconductor product. Thus, it becomes possible to compensate for the lack of precision of the production line and the integration of particularly sophisticated circuits directly on the silicon substrate can be considered, and in particular a complete transmission—reception set in a single semiconductor product.

It remains that this new component, whose applications will increase and be diversified in the future, must be associated with an powerful control chain in order to fully benefit from the new possibilities it presents. Indeed, it is observed that while a discrete component varies little according to the production line (thanks to selection) or according to temperature (it is located on a distinct circuit), the case is very different when said component is arranged on a substrate with other electronic circuits and with whom it shares temperature variations.

The control chain of the new acoustic component comprising the BAW resonator will have not only to compensate for the insufficiencies related to the integrated resonator manufacturing process, but also to deal with the resonator's sensitivity to temperature.

Such is the purpose of this application.

BRIEF SUMMARY OF THE INVENTION

An embodiment of the present invention provides an integrated circuit equipped with a BAW type acoustic resonator having great performances with regards to selective filtering.

Another embodiment of this invention comprises providing a control circuit particularly adapted to an acoustic component integrated into a semiconductor product, comprising a BAW resonator associated with two partner elements, respectively an inductive one and a capacitive one.

Another embodiment of this invention allows a complete integration of a radio transmit and receive circuit in the same semiconductor product.

One embodiment of the invention is an electronic circuit comprising at least a first resonator element that can be adjusted by means of an electric signal ($V_{tune}$) having a resonant frequency and an antiresonant frequency. The first variable resonator component is integrated in a silicon substrate and is inserted in a "Slave" electronic circuit.

The embodiment further comprises at least a second tunable resonator element arranged on said substrate and tunable via the same electric signal ($V_{tune}$) and being integrated into a "Master" control loop.

According to one embodiment, the first and second resonator elements are associated with a first partner element of the inductive type that is set to a value close to resonant and antiresonant frequencies. Moreover, a second partner element of the capacitive type, generally variable, makes it possible to adjust value $V_{tune}$.

Thus, adjustment of the tunable acoustic component, which is in the Slave block, is obtained very advantageously. Consequently it is possible to compensate for the insufficiencies of the manufacturing process in order to integrate an acoustic component whose characteristics are defined precisely, or even to adjust an acoustic component that could be used for many applications, including integration of a very effective tunable adjustable filtering function on a silicon substrate.

In an embodiment, resonator components comprise a capacitive partner element that is a varactor that is controlled by a control signal (Vtune).

Alternatively, resonator components comprise an inductive partner element formed by the assembly of a gyrator and a capacitive element, adjustable or not.

The adjustable capacitive element will be achieved—if necessary in an embodiment—by means of a varactor.

In another embodiment, the gyrator is composed of a pair of transconductance amplifiers whose polarization point is set by the electric control signal.

The Master control circuit includes a phase-locked loop (PLL) in an embodiment.

Alternatively or cumulatively, the Master control circuit could include an amplitude-locked loop (ALL).

In another embodiment, a control loop is provided for setting the value of the acoustic resonator's quality coefficient.

One embodiment of the invention is particularly adapted to the design of adjustable linear filters that can be integrated in an integrated circuit, and in particular usable in mobile telephony.

BRIEF DESCRIPTION OF THE SEVERAL VIEWS OF THE DRAWINGS

Other features of one or more embodiments of the invention will best be understood by reference to the following detailed description when read in conjunction with the accompanying drawings, wherein.

Figure 4A:
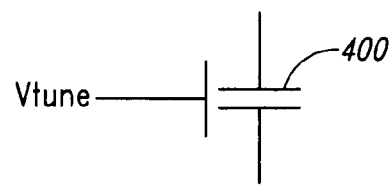
FIG. 4a illustrates tuning of said acoustic component by a varactor.
Figure 4B:
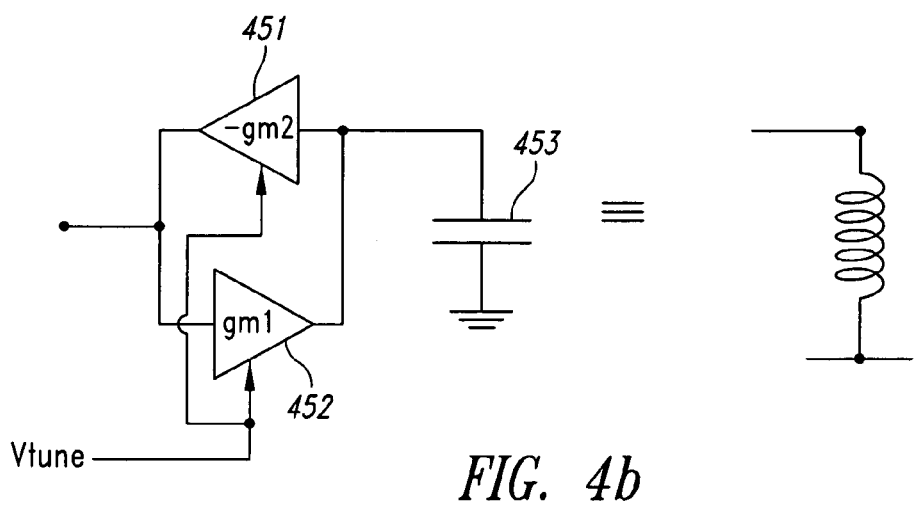
FIG. 4b illustrates the tuning of said adjustable acoustic component by an active inductor.
Figure 4C:
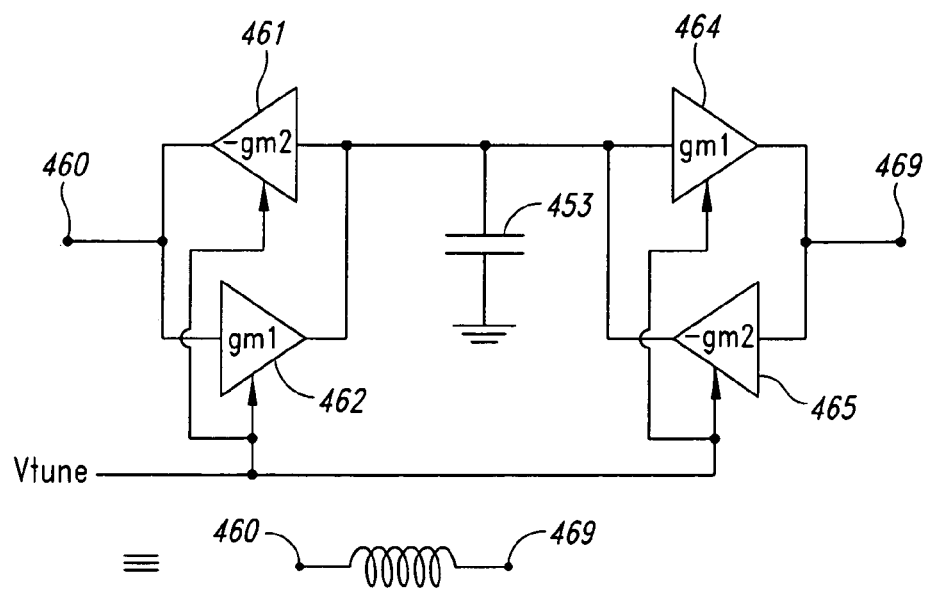

The FIG. 4c illustrates the tuning of said adjustable acoustic component by an active floating inductor.

Figure 5:
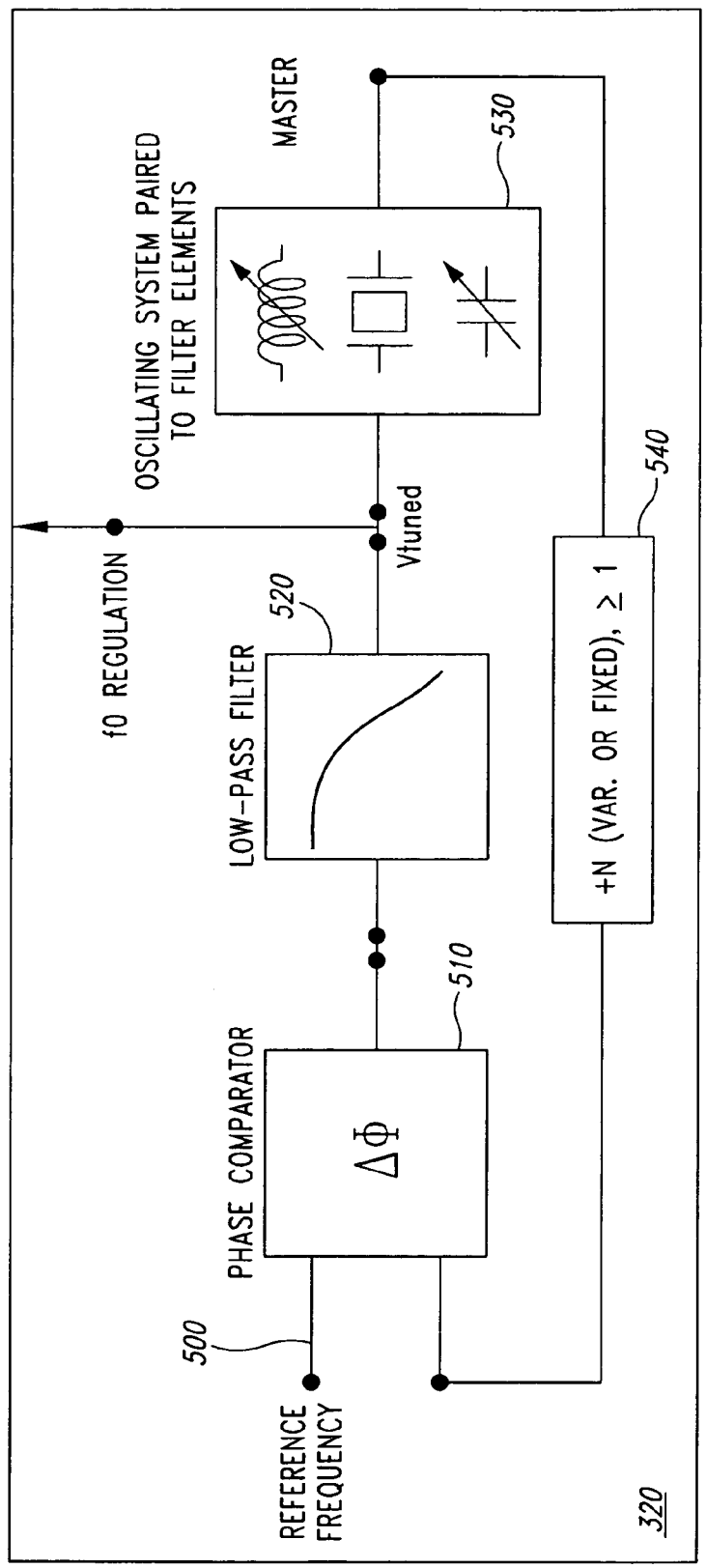

FIG. 5 illustrates a first control chain—PLL-type—of an embodiment of a circuit including an adjustable acoustic component.

Figure 6:
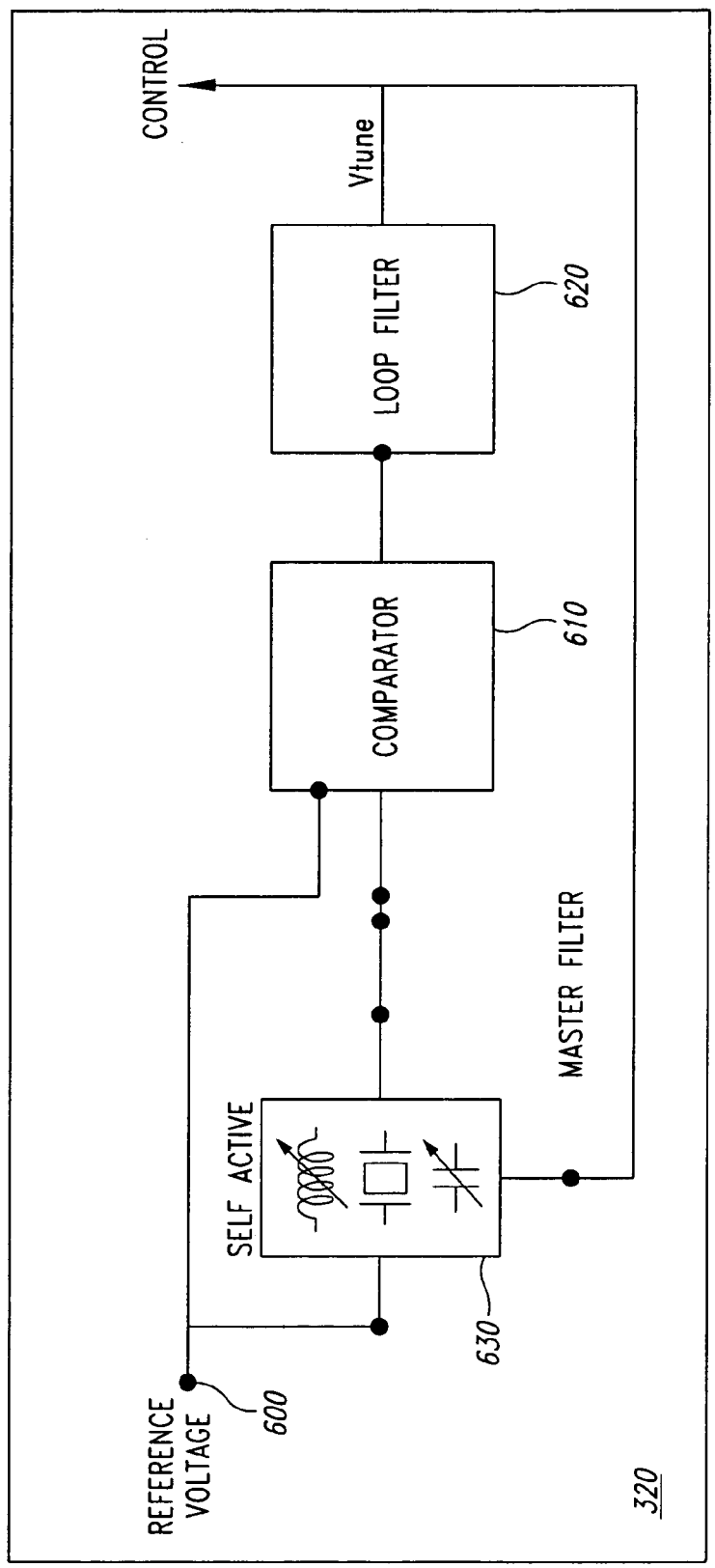

FIG. 6 illustrates a second control chain—ALL-type—of an embodiment of a circuit including an adjustable acoustic component.

Figure 7:
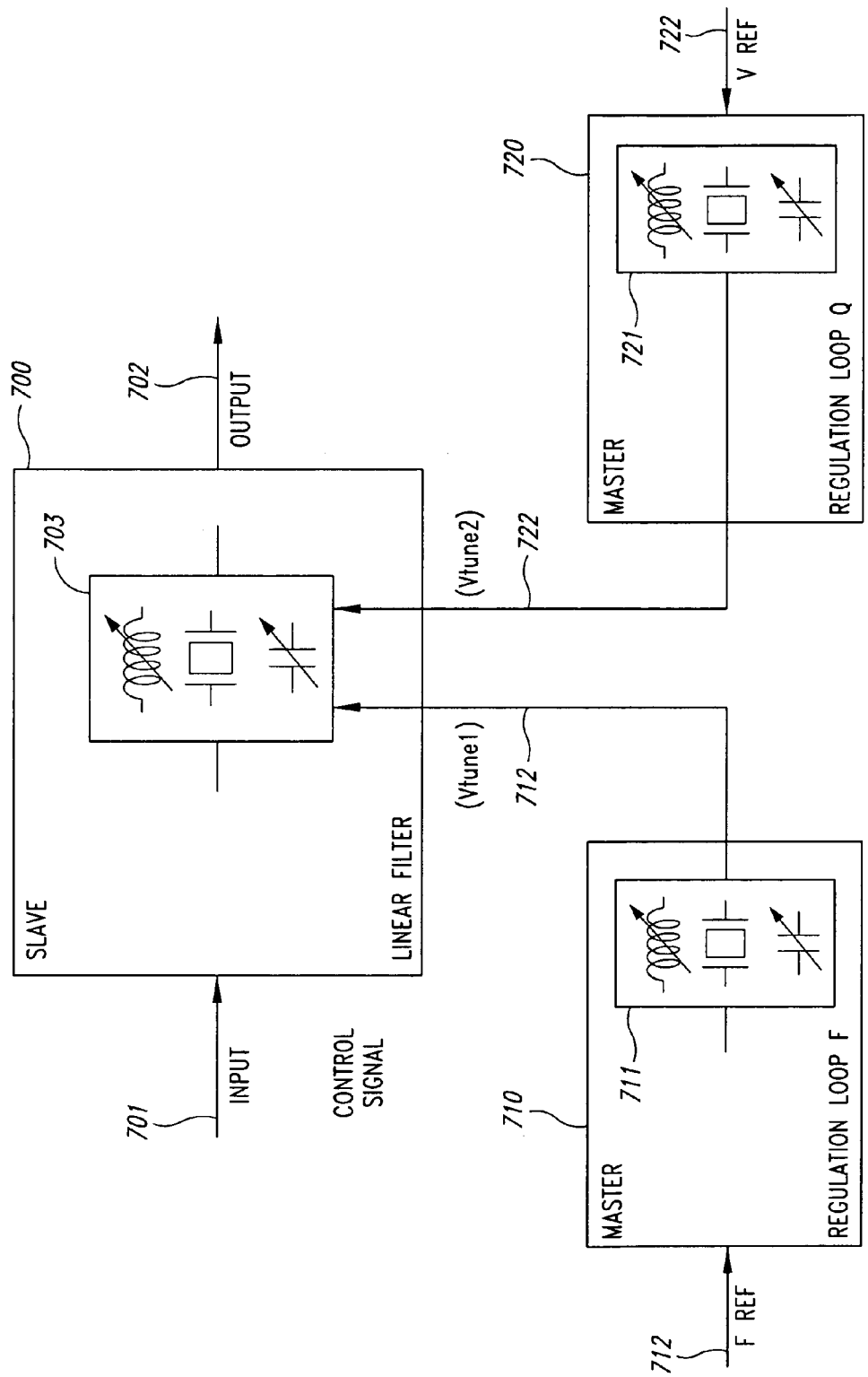

FIG. 7 illustrates a third example of a control chain controlling a circuit including an adjustable acoustic component, systematically based on a PLL loop and an ALL loop, according to an embodiment.

Figure 8A:
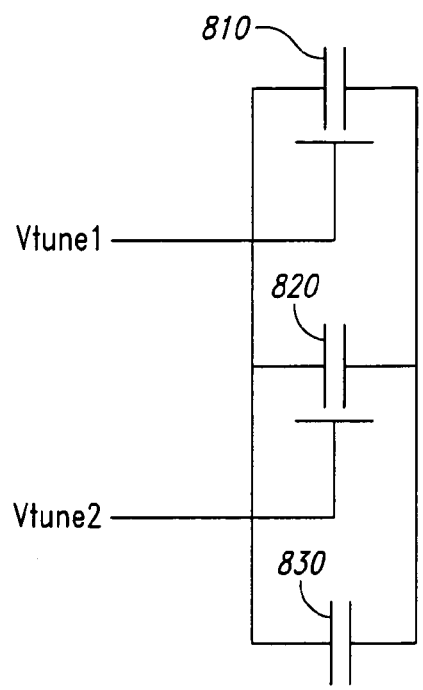
Figure 8B:
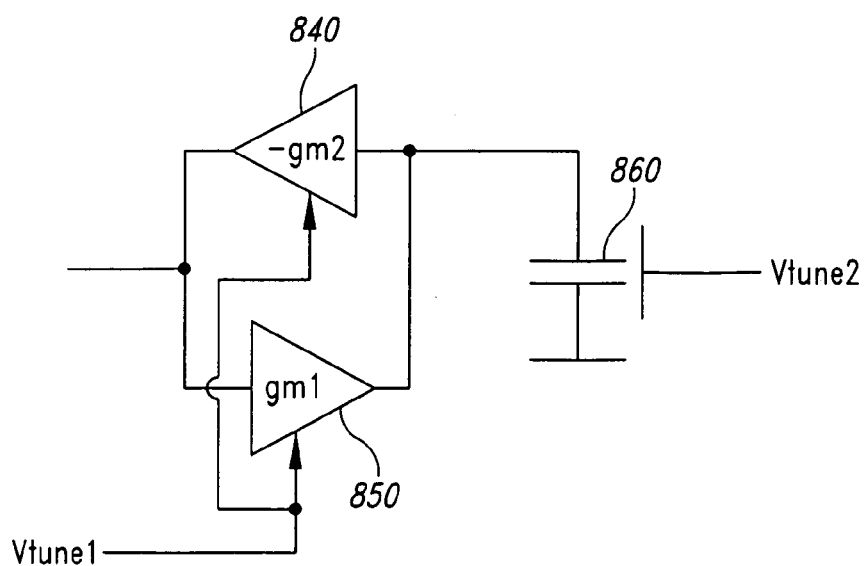

FIGS. 8a and 8b respectively describe two embodiments of the partner components associated with the adjustable resonator element.

DETAILED DESCRIPTION

Embodiments of an integrated electronic circuit comprising a tunable resonator are described herein. In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

We will now more specifically describe an embodiment of a circuit comprising an integrated resonator according to the present invention, and adapted to the design of an RF signal receive circuit that can be used in mobile telephony in particular.

In mobile telephony, and in particular in the most recent applications such as Wide Code Division Multiplexing Access (WCDMA), there is a need for realizing a particularly effective filtering in order to separate extremely close channels. It should be noted that this is only one nonrestrictive example of use of the new integrable acoustic component, the characteristics of which will now be disclosed.

An embodiment of the invention makes it possible to carry out such filtering in a particularly effective and completely integrated manner by means of a new Tunable resonator component (TRC) (i) that is integrated in a very powerful Master/Slave architecture (II).

Several examples of realization are described hereafter.

I. Integrable Tunable Resonator Component (TRC)

One embodiment of the invention is based on the use of a new acoustic component, hereafter designated by the expression Tunable Resonator component (TRC)—as described in French patent application No. 0315480 (ref. 03-GR1-267) filed on Dec. 29, 2003, and the principal characteristics of which will be summarized hereafter—for clarity's sake.

To this end, an acoustic resonator based on a dielectric medium arranged on a reflecting element, such as a Bragg mirror or a receiver for example, is used. Layers having different acoustic properties and different dielectric constants are stacked on a silicon substrate. Such an acoustic element is known as a Surface Mounted Resonator (SMR).

Alternatively, the resonator could be of the Film Bulk Acoustic Resonator type (FBAR), namely a resonator located above a cavity to allow the reflection of acoustic waves and to avoid damping thereof.

Figure 1A:
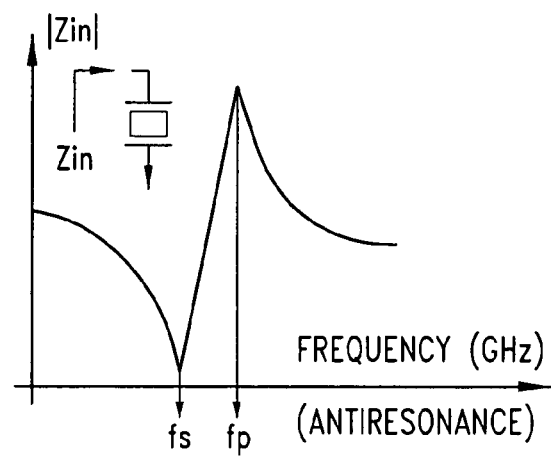
FIG. 1a illustrates an impedance curve of an example BAW-type acoustic resonator.
Figure 1B:
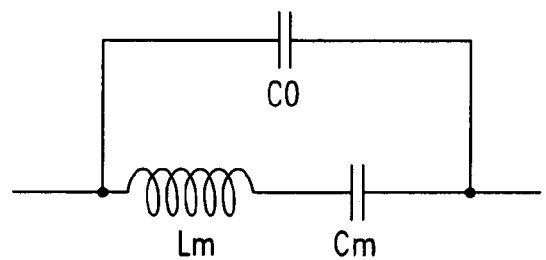
FIGS. 1b and 1c show the equivalent electric diagram of an example BAW-type acoustic resonator, respectively in series and parallel.

A BAW resonator has two very close resonant frequencies, $f_s$ (series) and $f_p$ (parallel) respectively, as illustrated in FIG. 1a. When referring to an equivalent electric diagram shown in FIG. 1b, it amounts to considering two LC-type resonator circuits, series and parallel respectively, composed of elements Lm, Cm and C0.

In the known approach, both resonant circuits are simultaneously used for filtering, as it is the case in document "RF MEMS CIRCUIT DESIGN FOR WIRELESS COMMUNICATIONS", Hector J De Los Santos, Artech House, ISBM 1-58033 329-9, 2002, p. 163 and following, for example.

On the contrary, in the new approach that is proposed, the TRC comprises a BAW resonator which is associated with at least two partner elements and, in one embodiment, with a first inductive partner element, variable or fixed, active or passive, and with a second generally variable capacitive partner element.

It has been noted that there is a great advantage in choosing a first partner element that is inductive and set close to the resonant and antiresonant frequencies. In a particular embodiment, a spiral inductor integrated directly on the silicon substrate is used.

Alternatively, the first partner element is a variable inductor set in the vicinity of the resonant and antiresonant frequencies, according to an electric signal $V_{tune}$.

The second partner element is a capacitive element and it generally varies according to an electric signal, for example electric signal $V_{tune}$.

By controlling said electric signal $V_{tune}$ it is possible to considerably modify the characteristics of Tunable Resonator Component composed of the acoustic resonator and its two partner elements.

It was observed that the combination of partner elements chosen as mentioned above made it possible to adjust the characteristics of the TRC to a large extent, and in particular the characteristics of any integrated electronic circuit comprising such TRC, without affecting too much the overall performance of this circuit (resonant and antiresonant frequencies, quality factor).

Then, inaccuracies in the manufacturing process and temperature sensitivity can be corrected and it is even possible to have a means for tuning the new acoustic component.

Figure 2A:
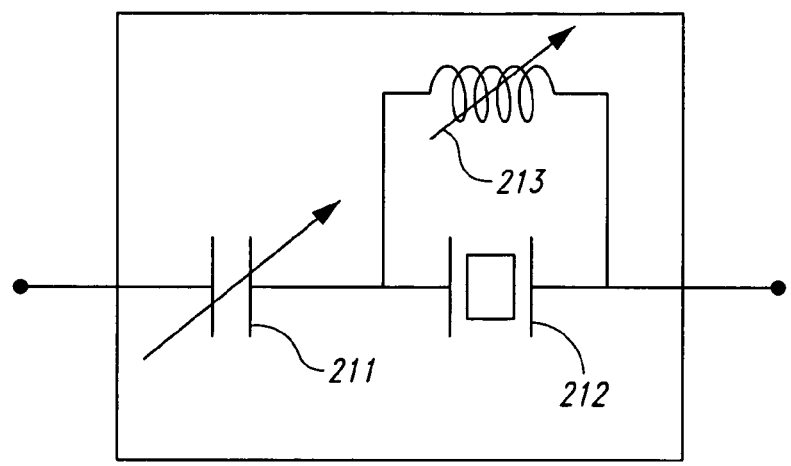
FIGS. 2a and 2b illustrate two embodiments of a tunable resonator element that is controlled by an electric signal.

FIG. 2a illustrates a first embodiment of a TRC in which the series resonance of a BAW resonator 212 is acted upon. To this end, an inductor 213 whose inductance is variable so that it can be adjusted in order to start resonating with the parallel capacity of the resonator (which is close to frequency $f_p$) or in the vicinity of this frequency, is assembled in parallel connection with resonator 212.

It is then possible to really act on the series resonance and control the resonant frequency by means of a capacitive tuning element 211.

Figure 1C:
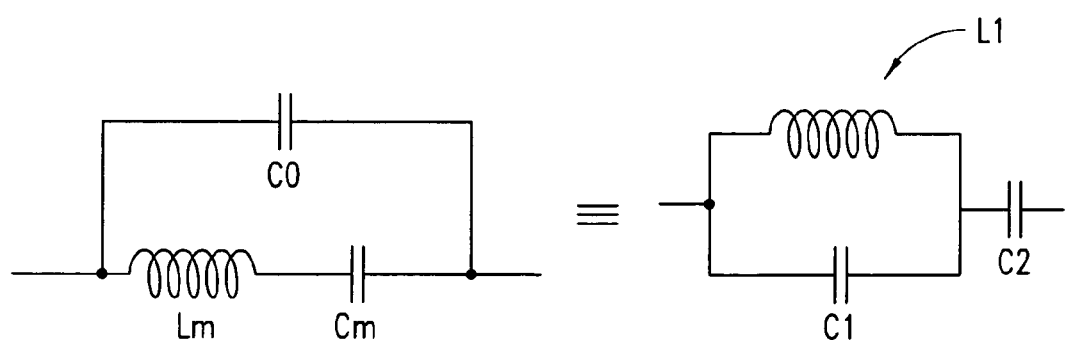
Figure 2B:
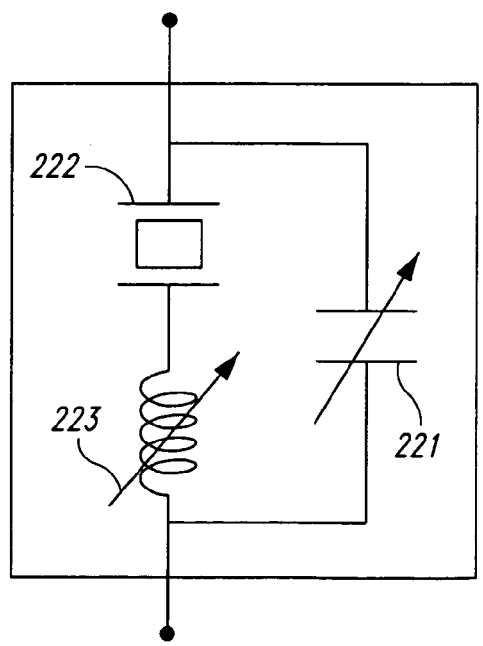

FIG. 2b corresponds to a second embodiment of a TRC in which the parallel resonance of a BAW resonator 222 is now acted upon. To this end, this time an inductor 223 that is variable in order to be adjusted so that it starts resonating with the equivalent series capacity (C2) close to frequency $f_s$ of the resonator of the FIG. 1c, or in the vicinity of this frequency, is connected in series with resonator 222. Then, a capacitive tuning element (221) is connected in parallel with both series elements, to interact with the parallel resonance of resonator 222 and set it to frequency $f_p$.

Thus, through the combined action of partner elements 221 and 223, it is possible to adjust the operational frequency—within a broad range—by means of tuning element 211 or 221 according to the case.

Thus, there is a true co-operation between tuning element 211 (or 221) and inductor 213 (resp. 223) that, by its action in the vicinity of both resonant and antiresonant frequencies of the acoustic resonator, reinforces the capacitive tuning effect of 211 (resp. 221).

This results in a new tunable resonator component, having a BAW resonator with a high quality coefficient, associated with its two partner elements.

Thus, great flexibility is provided by this new tunable resonator component that can be integrated into a silicon product directly. Consequently, it paves the way for new multiple developments of integrated circuits from the moment it is possible to effectively control its operation point by means of the tuning carried out by its partner elements.

Indeed, the circuit that will now be described, which allows to control the operation point of the new acoustic component, not only allows to compensate for the insufficiencies of the manufacturing process, but also precisely sets the operation point in spite of temperature variations.

II. Integration of the New Tunable Resonator Element in a Master-Slave Architecture FIG. 3 illustrates one embodiment of a Master-Slave architecture incorporating the Tunable Resonator Component (TRC) that makes it possible to precisely adjust the operating characteristics of any circuit incorporating said TRC component.

Figure 3:
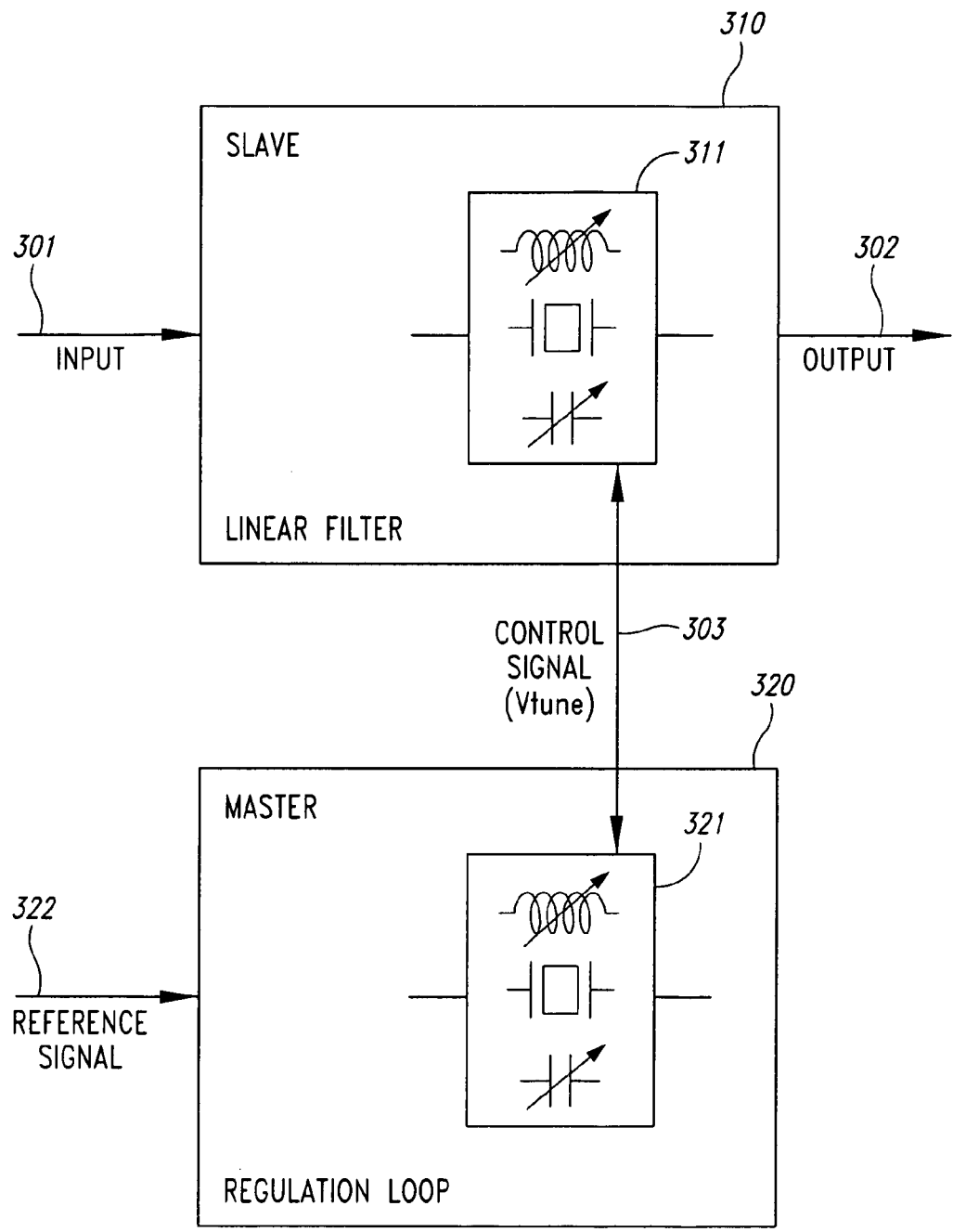
FIG. 3 illustrates the integration of a tunable resonator element in a Master-Slave architecture according to one embodiment of the present invention.

As can be seen in FIG. 3, a TRC 311 is inserted in a circuit or block 310—a Slave block—realizing an electronic function integrated into a semiconductor product. As described previously, TRC 311 comprises a BAW resonator along with two partner elements: a first active or passive, fixed or variable, inductive element combined with a second, generally variable, capacitive element.

In one embodiment, block 310 is used as an integrated linear filtering circuit using the high quality coefficient of the BAW resonator, and having an input electrode or a pair of input electrodes 301 and an output electrode or a pair of output electrodes 302.

The circuit according to an embodiment of the invention further comprises a second circuit or block 320, a Master block, linear or not linear, equipped with a second TRC 321 that is homothetic to TRC 311. To this end, the partner elements of components 311 and 321 as well as BAW resonators are paired. Specifically, BAW resonators should have the same geometry (or at least be homothetic); they should be issued from the same manufacturing process and arranged close to one another on the same substrate in order to be subjected to the same temperature conditions.

A reference value 322 that should be extremely stable, controls the second Master circuit 320. In practice, for example, a reference frequency from a quartz oscillator or a reference voltage generated by a band-gap block will be selected.

Each tunable acoustic component has a control electrode receiving a controlling electric signal, which will noted $V_{tune}$, via a circuit 303.

Electric signal $V_{tune}$, voltage or current, is transmitted to one or more partner elements of each TRC.

People qualified in the art could consider various embodiment allowing to act on the partner elements of the BAW resonator.

As a non-restrictive example, in a first embodiment illustrated in FIG. 4a, the partner element of the capacitive type is a varactor receiving electric signal $V_{tune}$ to a control electrode. Thus, the value of the capacitive element associated with the BAW resonator can be adjusted.

FIG. 4b illustrates another embodiment in which the variable inductive element is built by means of an active inductor comprising a gyrator element, made up of two head-to-tail transconductance amplifiers 451 and 452 that is charged by a capacitive element 453, the second amplifier inducing a change of polarity. By acting on capacitive element 453—which could be a varactor receiving control signal $V_{tune}$, like previously—it is possible to make a variable inductive element, one electrode of which is connected to ground.

The diagram of FIG. 4c illustrates the structure of a variable floating inductive element between two electrodes 460 and 469. To this end, a first gyrator formed of two head-to-tail transconductance amplifiers 461 and 462 is inserted between electrode 460 and capacitor 53, the second amplifier inducing a change in polarity. Similarly, a second gyrator formed of two head-to-tail transconductance amplifiers 464 and 465 is inserted between electrode 469 and capacitor 453, with the second amplifier inducing polarity change.

Alternatively, the polarization current of the transconductance amplifiers forming the gyrator(s) could be controlled by electric signal $V_{tune}$, in order to adjust the gyrator's "gm" parameter and, consequently, the value of the inductive element associated with the BAW resonator.

Other embodiments allowing adjustment of the partner elements associated with resonators contained in components 311 and 321 could be considered.

It will be also noted that a single resonator component for each of circuits or blocks 310 and 320 was shown, for clarity's sake. However, it is clear that people qualified in the art could readily adapt an embodiment to the construction of a block 310 (and 320) comprising several resonator components in lattice or ladder assembly or mounted in any other possible manner.

According to one embodiment, circuit or block 320—the Master circuit—is integrated into a control circuit for precisely controlling the operation point of adjustable acoustic component 320 via electric control signal $V_{tune}$.

By copying the value to the control input of component 311 located in Slave block 310, a particularly effective control of the operation point of block 310 is achieved.

The control loop produced within Master block 320 makes it possible to control the characteristics of the dual component located within Slave block 310, thus allowing adjustment thereof.

First, the imperfections resulting from the manufacturing process of semiconductor product can be corrected and defects in manufacturing tolerances can be compensated for. As a result it becomes possible to integrate a BAW resonator in an integrated circuit while avoiding to discard a whole circuit when only its BAW component does not show the desired characteristics.

Secondly, in addition to correcting tolerance defects, thanks to the Master-Slave architecture that has been just described, one controls the resonant characteristics of the resonator element by means of the control loop achieved by block 320.

This control loop allows an adjustment that is independent of the manufacturing process, and also independent of the temperature.

In order to show the great flexibility of the invention, and the multiple possibilities of control that are offered to integrated circuit designers, several particularly effective examples of control will now be described.

III. Examples of Control Loops

A. Frequency Control Through Integration of the Second TRC in a PLL Loop

FIG. 5 describes a first example of frequency control that could be used to select the WCDMA receive band. To this end, BAW resonator element 320 is integrated into a phase-locked loop (PLL).

To this end, circuit or block 320 comprises a phase comparator 510 having a first input 500 receiving a reference frequency that should be as stable as possible. Phase comparator 510 has a second input receiving the output of a dividing element 540.

The output of the phase comparator is fed to a low-pass filter 520 that outputs a voltage $V_{tune}$ used to control a TRC component 530 arranged in the Master block. This voltage is used as a control signal for the dual TRC component (not shown on FIG. 5) that is located in the Slave block and is used as a desired linear filter.

TRC component 530 is integrated in an oscillating system all the elements of which are paired with elements of the Slave block. The oscillating system of the Master block generates an output frequency that is transmitted to the dividing element 540 ensuring division by a number N equal to or higher than 1, fixed or variable, integer or fractional.

Thus, thanks to this regulation pattern, a frequency control generated by the oscillating circuit on a multiple of N times the input frequency of the Master block is achieved.

This control is reproduced in the dual TRC component located in Slave block 310 in order to precisely set the operation point of circuit 310, and consequently, to adjust parameters of the linear filter made up by block 310, in particular its midband frequency.

People qualified in the art will be able to adapt the teaching of the invention to the design of another type of frequency control, and in particular Frequency-Locked Loop (FLL).

More generally, multiple different control alternatives, and in particular an ALL-type control loop could be considered.

B. ALL-type Control Loop Control

FIG. 6 illustrates a second example of a Master block 320 in which an Amplitude-Locked Loop (ALL) is advantageously carried out.

To this end, the circuit comprises a voltage comparator 610 having a first input 600 receiving a reference voltage that should be as stable as possible. Comparator 610 has a second input receiving a voltage resulting from the operation of a linear phase response circuit, as a filter, using an adjustable TRC component equipped with two partner elements, as described previously.

Comparator 610 outputs an error that is filtered by a loop filter 620—generally a low-pass filter—which generates a control voltage $V_{tune}$ which is transmitted to the control electrodes of both paired TRC, respectively located in Slave block 310 and Master block 320.

As previously described, control voltage $V_{tune}$ could be used to control a varactor, an active inductor etc. . . . , in order to precisely adjust the operation point of the tunable resonator element in Master block 320.

The operation point of the one or more adjustable resonator components located in Slave block 310 can thus be indirectly controlled.

C. Control of the Quality Factor of the Resonator Element and of its Midband Frequency The frequency and voltage control loops that have just been described are not necessarily mutually exclusive. We will now describe how they can advantageously combine to carry out an extremely sophisticated and very advantageous control.

In this third example of control, the Master circuit comprises, simultaneously, a first phase-locked loop (PLL), as previously described, associated or combined with an amplitude-locked loop (ALL) for controlling the quality factor of said TRC circuit.

To this end in FIG. 7, one provides a first Master block 710 comprising at least a first adjustable TRC 711 (similar to the previously described ones) and receiving a particularly stable reference frequency at an input 712. The first block is typically a frequency control carried out by means of a PLL loop as previously described, based on a resonant frequency.

This first Master block generates a first electric control signal, $V_{tune}1$ that is transmitted to a tunable resonator element TRC 703 located in a Slave block 700. As previously, Slave block 700 could be used to achieve any linear filtering function, even any electric circuit.

A second Master block 720 is also provided, which comprises a second tunable resonator element 721 similar to the previous one and receiving a particularly stable reference voltage at an input 722. Second block 720 is used to control the quality factor of tunable resonator element 721 in order to adjust the quality coefficient of Slave resonator 703, by mirroring effect, by means of a second electric signal $V_{tune}2$.

As can be seen in FIG. 7, tunable resonator component 703 that is arranged in Slave block 700 receives two electric control signals, $V_{tune}1$ and $V_{tune}2$ that can be advantageously combined to control the parameters of both inductive and capacitive partner elements.

To this end, several embodiments could be considered.

In a first mode, as represented in FIG. 8a, both electric control signals $V_{tune}1$ and $V_{tune}2$ are respectively used to control two varactors that are arranged in a stack of capacitor/varactors assembled in parallel.

Thus, a double control of adjustable resonator 703 is achieved, frequency control and quality coefficient control.

Alternatively, voltages $V_{tune}1$ and $V_{tune}2$ are used to control an active inductor, made up of a varactor and a gyrator, whose both elements are controlled by electric signals $V_{tune}1$ and $V_{tune}2$ respectively.

Such quality coefficient control and frequency control are particularly useful to maintain performances of BAW resonator 703 and to make them insensitive to manufacturing process and temperature.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An electronic circuit, comprising:
   at least a first resonator element that can be adjusted by an electric signal having a resonant frequency and an antiresonant frequency, said at least first resonator element being arranged on a semiconductor product substrate and inserted in a slave circuit; and
   at least a second resonator element arranged on said substrate and being adjustable via the electric signal, said at least second resonator element being integrated in a master control loop;
   wherein each one of said first and second resonator elements is associated with a first partner element of an inductive type fixed in the vicinity of said resonant and antiresonant frequencies, and with a second partner element of a capacitive type, at least one of the two partner elements being adjustable by said electric signal.

2. The circuit according to claim 1 wherein said electric signal is a control voltage.

3. The circuit according to claim 1 wherein said capacitive element associated with the resonator element is a varactor controlled by said electric signal.

4. The circuit according to claim 1 wherein said inductive element associated with the resonator element comprises a spiral inductor arranged on the semiconductor substrate of said resonator.

5. The circuit according to claim 1 wherein said inductive element associated with the resonator comprises a gyrator having two transconductance amplifiers and a capacitor, said electric signal setting a polarization point of said amplifiers.

6. The circuit according to claim 1 wherein said inductive element associated with the resonator comprises a gyrator having two transconductance amplifiers and a varactor, said electric signal adjusting a value of a capacity of said varactor.

7. The circuit according to claim 1 wherein said second adjustable resonator element is integrated into a phase-locked loop circuit including:
   a phase comparator having a first input, a second input and an output, said first input receiving a reference frequency;
   a low-pass filter having an input connected to said output of said phase comparator and having an output generating said electric control signal;
   an oscillator comprising said at least second resonator element having an output generating an oscillating signal; and
   a dividing block having an input receiving the oscillating signal and an output connected to said second input of said phase comparator.

8. The circuit according to claim 1 wherein said second adjustable resonator element comprises part of an amplitude-locked loop circuit including:
   a circuit comparator having a first input, a second input and an output, said first input receiving a reference voltage value;
   a low-pass filter having an input connected to said output of said comparator circuit and having an output generating said electric control signal; and
   a linear phase response circuit comprising said at least second resonator element generating an electric signal transmitted to said second input of said comparator circuit.

9. The circuit according to claim 1 wherein the circuit comprises a control loop for controlling quality coefficient based on an amplitude-locked loop.

10. The circuit according to claim 1 wherein the circuit comprises part of a frequency-locked loop circuit.

11. An acoustic resonator circuit intended for integration into a semiconductor product, the circuit comprising:
   a first block, a master block, included in a regulation loop, said first master block including at least a first adjustable resonator having first and second resonant frequencies, said at least first resonator being associated with at least one adjusting element having an inductor to cancel out said second resonant frequency and a capacitor to set tuning of said resonator to said first frequency; and
   a second block, a slave block, integrated into a linear circuit or a non-linear circuit, said second block including at least a second resonator paired to said at least first resonator,
   said regulation loop generating a control signal to control said adjusting element of said master block.

12. The circuit according to claim 11 wherein the slave block is used to achieve an integrated linear filter.

13. An apparatus, comprising:
   a first block including a first resonator, the first resonator element having first and second resonant frequencies and an adjustment element, the adjustment element including a first component to substantially cancel the second resonant frequency and a second component to tune the first resonator to the first resonant frequency in response to a control signal;
   a second block coupled to the first block, the second block including a second resonator element that is adjustable in response to the control signal; and
   a control loop coupled to the first and second blocks to provide the control signal.

14. The apparatus of claim 13 wherein the first block comprises part of a master block and the second block comprises part of a slave block.

15. The apparatus of claim 13 wherein at least the first resonator is arranged on a semiconductor product substrate.

16. The apparatus of claim 13 wherein the first and second resonators each include respective adjustment elements having first and second components, the first component comprising an adjustable inductive element having an inductance that can be varied to substantially cancel the second frequency, the second component comprising an adjustable capacitive element having a capacitance that can be varied in response to the control signal.

17. The apparatus of claim 13 wherein the first block includes:
   a phase comparator having a first input terminal to receive a reference frequency, a second input terminal, and an output terminal;
   a filter having an input terminal coupled to the output terminal of the phase comparator and having an output terminal to provide the control signal;
   an oscillator including the first resonator element, and having an output terminal to generate an oscillating signal and an input terminal coupled to the output terminal of the filter to receive the control signal; and
   a dividing block having an input terminal coupled to the output terminal of the oscillator to receive the oscillating signal and having an output terminal coupled to the second input terminal of the phase comparator.

18. The apparatus of claim 13 wherein the first block includes:
   a comparator having a first input terminal to receive a reference signal, a second input terminal, and an output terminal;
   a having an input terminal coupled to the output terminal of the comparator and having an output terminal to provide the control signal; and
   a response block having the first resonator element to generate an output signal to provide to the second input terminal of the comparator.

19. A system, comprising:
   a wireless device;
   a semiconductor product included in the wireless device; and
   an electronic circuit arranged on the semiconductor product, the electronic circuit including:
   at least a first resonator element that can be adjusted in response to a control signal, the first resonator element having first and second frequencies and being part of at least one slave circuit;
   at least a second resonator element that can be adjusted in response to the control signal and being part of at least one master circuit;
   an adjustment element included with each resonator element, the adjustment element having a first partner element responsive to the control signal to tune the resonator element to the first frequency and having a second partner element to substantially cancel the second frequency; and
   at least one coupling element between the master and slave circuits to communicate the control signal.

20. The system of claim 19 wherein the first resonator of the slave circuit is responsive to a plurality of control signals provided by respective master circuits via respective coupling elements, the plurality of control signals usable to respectively control the first and second partner elements.

21. The system of claim 20 wherein the plurality of control signals is usable to control an assembly having a capacitor and varactors coupled in parallel, the assembly comprising the first and second partner elements.

22. The system of claim 20 wherein the plurality of control signals is usable to control an active inductor comprising a varactor and a gyrator.

23. A system, comprising:
means for generating a control signal;
slave means, including a first resonator element having first and second frequencies and having first and second partner elements associated with the first resonator element, for using the first partner element to tune the resonator to the first frequency in response to the control signal and for using the second partner element to substantially cancel the second frequency; and
master means, including a second resonator element corresponding to the first resonator element, for providing the generated control signal to the first resonator element to control the first resonator element.

24. The system of claim 23, further comprising means for integrating the slave and master means on a semiconductor product usable with a wireless device.

25. The system of claim 23, further comprising means for controlling a quality coefficient of the second partner element.

26. A method for resonators having first and second frequencies, the method comprising:
coupling first and second elements to a first resonator of a master;
generating a control signal;
varying a characteristic of the first element to tune the first element close to the second frequency to substantially cancel the second frequency;
providing the generated control signal to the second element to adjust tuning of the first resonator to the first frequency; and
providing the generated control signal from the master to a second resonator, corresponding to the first resonator, of a slave and using the provided control signal to tune the second resonator of the slave to the first frequency.

27. The method of claim 26 wherein varying a characteristic of the first element includes varying an inductance of the first element, and wherein providing the control signal to the second element to adjust tuning of the first resonator includes providing the control signal to vary a capacitance of the second element.

28. The method of claim 26 wherein providing the generated control signal to the second resonator comprises providing a plurality of control signals, from a corresponding plurality of masters to the second resonator, the plurality of control signals being provided to the first and second elements to respectively control their adjustment.

29. The method of claim 26 wherein providing the generated control signal from the master to the second resonator includes providing the generated control signal from the master to the second resonator in a phase-locked loop circuit.

30. The method of claim 26 wherein providing the generated control signal from the master to the second resonator includes providing the generated control signal from the master to the second resonator in an amplitude-locked loop circuit.

31. The method of claim 26 wherein coupling the first and second elements to the first resonator of the master includes providing the first and second elements to the first resonator in a frequency-locked loop circuit.

* * * * *